US009088005B2

(12) United States Patent
Hong (10) Patent No.: US 9,088,005 B2
(45) Date of Patent: Jul. 21, 2015

(54) ORGANIC LIGHT EMITTING DIODE DISPLAY AND METHOD FOR MANUFACTURING THE SAME

(75) Inventor: Sang-Min Hong, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 185 days.

(21) Appl. No.: 13/212,355

(22) Filed: Aug. 18, 2011

(65) Prior Publication Data

US 2012/0293064 A1 Nov. 22, 2012

(30) Foreign Application Priority Data

May 19, 2011 (KR) .......................... 10-2011-0047444

(51) Int. Cl.
*H01L 51/56* (2006.01)
*H01L 51/52* (2006.01)
*B23K 26/20* (2014.01)

(52) U.S. Cl.
CPC .......... *H01L 51/5246* (2013.01); *H01L 51/524* (2013.01); *H01L 51/56* (2013.01); *B23K 26/206* (2013.01); *H01L 2251/56* (2013.01)

(58) Field of Classification Search
USPC .................................................. 313/500–512
See application file for complete search history.

(56) References Cited

U.S. PATENT DOCUMENTS

2005/0184927 A1* 8/2005 Kwak .............................. 345/45
2010/0109512 A1* 5/2010 Shin .............................. 313/504

FOREIGN PATENT DOCUMENTS

KR 10-2004-0049510 6/2004
KR 10-2009-0041613 4/2009

* cited by examiner

*Primary Examiner* — Mariceli Santiago
*Assistant Examiner* — Brenitra M Lee
(74) *Attorney, Agent, or Firm* — Robert E. Bushnell, Esq.

(57) ABSTRACT

An OLED display according to an exemplary embodiment includes: a first substrate; a second substrate arranged opposite to the first substrate; a sealant arranged in the shape of a closed loop along an edge of the second substrate between the first substrate and the edge of the second substrate; and a metal wire formed along the sealant between the first substrate and the sealant. One area of the metal wire has an opening pattern.

19 Claims, 6 Drawing Sheets

ORGANIC LIGHT EMITTING DIODE DISPLAY AND METHOD FOR MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 19 of May 2011 and there duly assigned Serial No. 10-2011-0047444.

BACKGROUND OF THE INVENTION

1. Field of the Invention

The present invention relates generally to an organic light emitting diode (OLED) display and a manufacturing method thereof. More particularly, it relates to an OLED display in which a sealant which seals a pair of substrates is cured using a laser, and a manufacturing method thereof.

2. Description of the Related Art

An organic light emitting diode (OLED) display has an emissive characteristic, and differs from a liquid crystal display (LCD) in that it does not require a separate light source and has reduced thickness and weight. Furthermore, as the OLED display has high quality characteristics such as lower power consumption, high luminance, and short response time, it has been spotlighted as a next generation display device for portable electronic appliances.

The OLED display includes a plurality of OLEDs respectively having a hole injection electrode, an organic emission layer, and an electron injection electrode. When the anode and cathode inject holes and electrons, respectively, into the organic light emitting layer, the OLEDs emit light using energy generated when excitons generated by electron-hole combinations in the organic light emitting layer are dropped from an excited state to a ground state, and an image is then displayed.

The OLED display is formed by sealing a pair of substrates respectively arranged opposite to each other, and interposing an organic light emitting element therebetween. The sealant is arranged to surround the organic light emitting element along an edge of the substrate.

However, the sealant should be uniformly cured so as to stably seal the pair of substrates. For curing a sealant, irradiation of a laser beam to the sealant has been recently used.

However, the curing of the sealant using the laser beam has a problem in uniform curing of the sealant. Particularly, the sealant is non-uniformly cured at the start and end points of the laser beam irradiation.

The above information disclosed in this Background section is only for enhancement of an understanding of the background of the described technology, and therefore it may contain information which does not form the prior art which is already known in this country to a person of ordinary skill in the art.

SUMMARY OF THE INVENTION

The present invention has been developed in an effort to provide an organic light emitting diode (OLED) display which can improve uniformity of a sealant which seals a pair of substrates while curing the sealant using a laser beam.

Furthermore, the present invention provides a manufacturing method of the OLED display.

An OLED display according to an exemplary embodiment may include a first substrate; a second substrate arranged opposite to the first substrate; a sealant arranged in the shape of a closed loop along an edge of the second substrate between the first substrate and the edge of the second substrate; and a metal wire formed along the sealant between the first substrate and the sealant. One area of the metal wire has an opening pattern.

The metal wire may be disconnected at the opening pattern.

The opening pattern may be formed in the shape of a zigzag.

The zigzag shape of the opening pattern may be continued in a direction which crosses a length direction of the metal wire while moving forward and backward along the length direction of the metal wire.

The OLED display may further include an organic light emitting element, and the organic light emitting element may be surrounded by the sealant.

The OLED display may further include an additional metal layer filling the opening pattern.

The additional metal layer may be formed of a metal, the thermal conductivity of which is relatively lower than that of a metal forming the metal wire.

According to an exemplary embodiment, a method for manufacturing OLED display is provided. The method for manufacturing OLED display may include preparing a first substrate; forming a metal wire along an edge of the first substrate; arranging a sealant on the metal wire in a closed loop shape along an edge of the first substrate; arranging a second substrate opposite to the first substrate, the sealant being interposed therebetween; and curing the sealant by irradiating a laser beam. One area of the metal wire has an opening pattern, and the laser beam is irradiated onto the sealant at the one area.

The laser beam may be irradiated onto the sealant at the one area.

The opening pattern may be formed in the shape of a zigzag.

The zigzag shape of the opening pattern may be continued in a direction crossing a length direction of the metal wire while reciprocating along the length direction of the metal wire.

The method for manufacturing OLED display may further include forming an organic light emitting element on the first substrate. The sealant may be formed so as to surround the organic light emitting element.

The method for manufacturing OLED display may further include forming an additional metal layer which fills the opening pattern.

The additional metal layer may be formed of a metal, the thermal conductivity of which is relatively lower than that of a metal forming the metal wire.

According to the exemplary embodiments, the OLED display can cure a sealant which seals a pair of substrates using a laser beam, and which can simultaneously improve uniformity of the sealant.

Furthermore, the OLED display can be effectively manufactured.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

In various exemplary embodiments, the same reference numerals are used for elements having the same configuration and will be representatively described in a first exemplary embodiment. In other exemplary embodiments, only elements different from those of the first exemplary embodiment will be described.

In order to clarify the present invention, parts which are not connected to the description will be omitted, and the same elements or equivalents are referred to by the same reference numerals throughout the specification.

In addition, the size and thickness of each component shown in the drawings are arbitrarily shown for understanding and ease of description, but the present invention is not limited thereto. Therefore, an exemplary embodiment is not restrictive to the illustration. Furthermore, it will be understood that, when an element such as a layer, film, region or substrate is referred to as being "on" another element, it can be directly on the other element or intervening elements may also be present.

Figure 1:
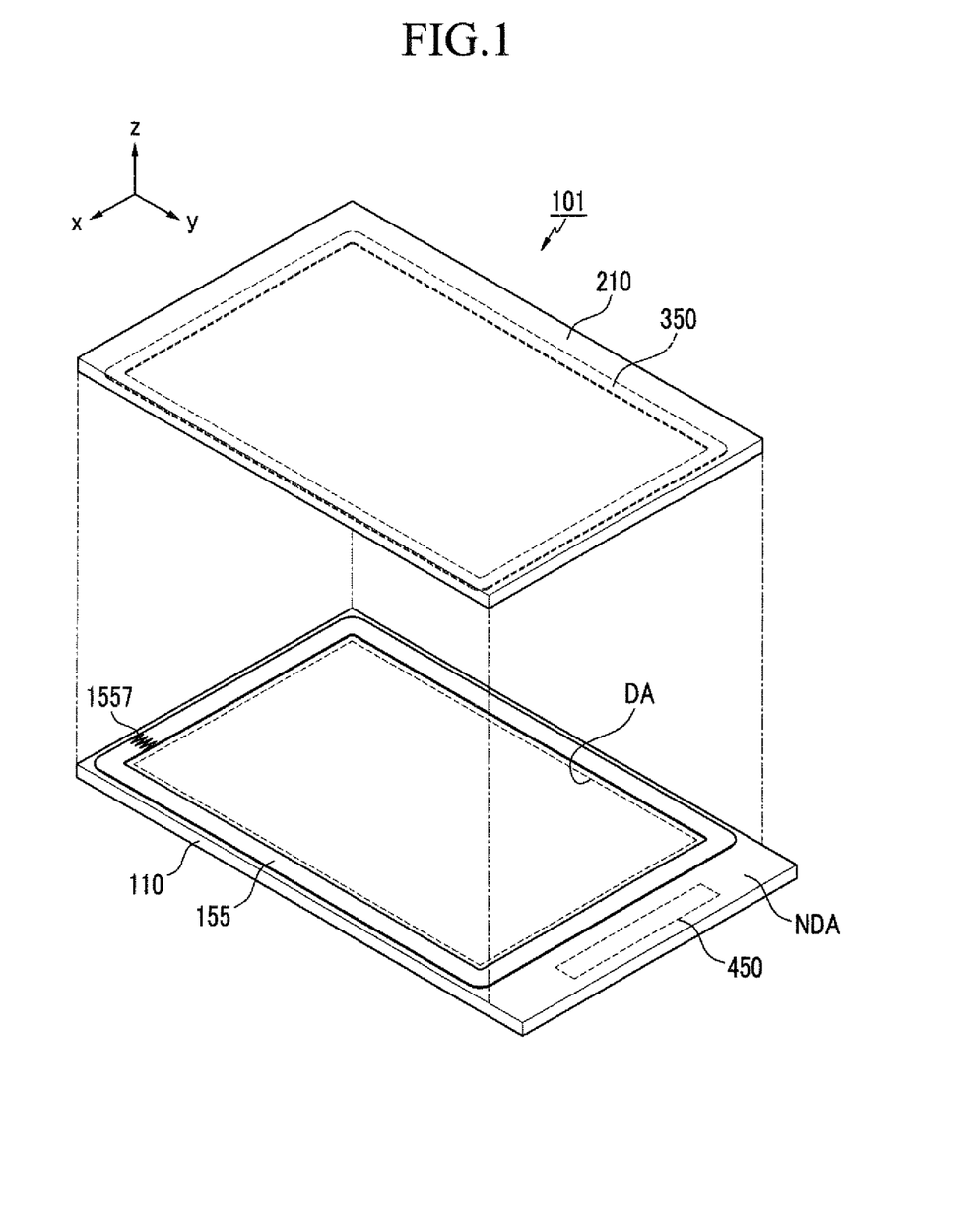
FIG. 1 is an exploded perspective view of an organic light emitting diode (OLED) display according to an exemplary embodiment of the invention.

FIG. 1 is an exploded perspective view of an organic light emitting diode (OLED) display according to an exemplary embodiment of the invention.

Hereinafter, an organic light emitting diode (OLED) display according to a first exemplary embodiment will be described with reference to FIG. 1.

As shown in FIG. 1, the OLED display 101 according to the first exemplary embodiment includes a first substrate 110, a second substrate 210, a metal wire 155, and a sealant 350.

The first substrate 110 may be formed as a transparent insulating substrate made of glass, quartz, ceramic, and the like. The first substrate 110 is divided into a display area DA and a non-display area NDA. The display area DA is disposed in the center of the first substrate 110, and the non-display area NDA is disposed at the periphery of the first substrate 110.

An organic light emitting element 70 and a thin film transistor 10 connected to the organic light emitting element 70 (shown in FIG. 5) are formed in the display area DA of the first substrate 110.

The second substrate 210 is arranged opposite the first substrate 110. Like the first substrate 110, the second substrate 210 is formed of a transparent insulating substrate made of glass, quartz, ceramic, and the like. The second substrate 210 may be relatively larger in size than the first substrate 110.

In this case, the size of the second substrate 210 is large enough to entirely cover the display area DA of the first substrate 110.

A part of the non-display area NDA of the first substrate 110, not overlapped with the second substrate 210, may include an installation area 450 in which an integrated circuit (IC) chip is installed.

The sealant 350 is disposed between the first substrate 110 and an edge of the second substrate 210. The sealant 350 is formed in the shape of a closed loop and is disposed along edges of the first substrate 110. That is, the sealant 350 is formed in the non-display area NDA so as to surround the display area DA of the first substrate 110. The sealant 350 seals the first substrate 110 and the second substrate 210 relative to each other.

In addition, the sealant 350 may be made of various materials known to a person skilled in the art. Furthermore, in the first exemplary embodiment, the sealant 350 may be cured by a laser beam.

Figure 2:
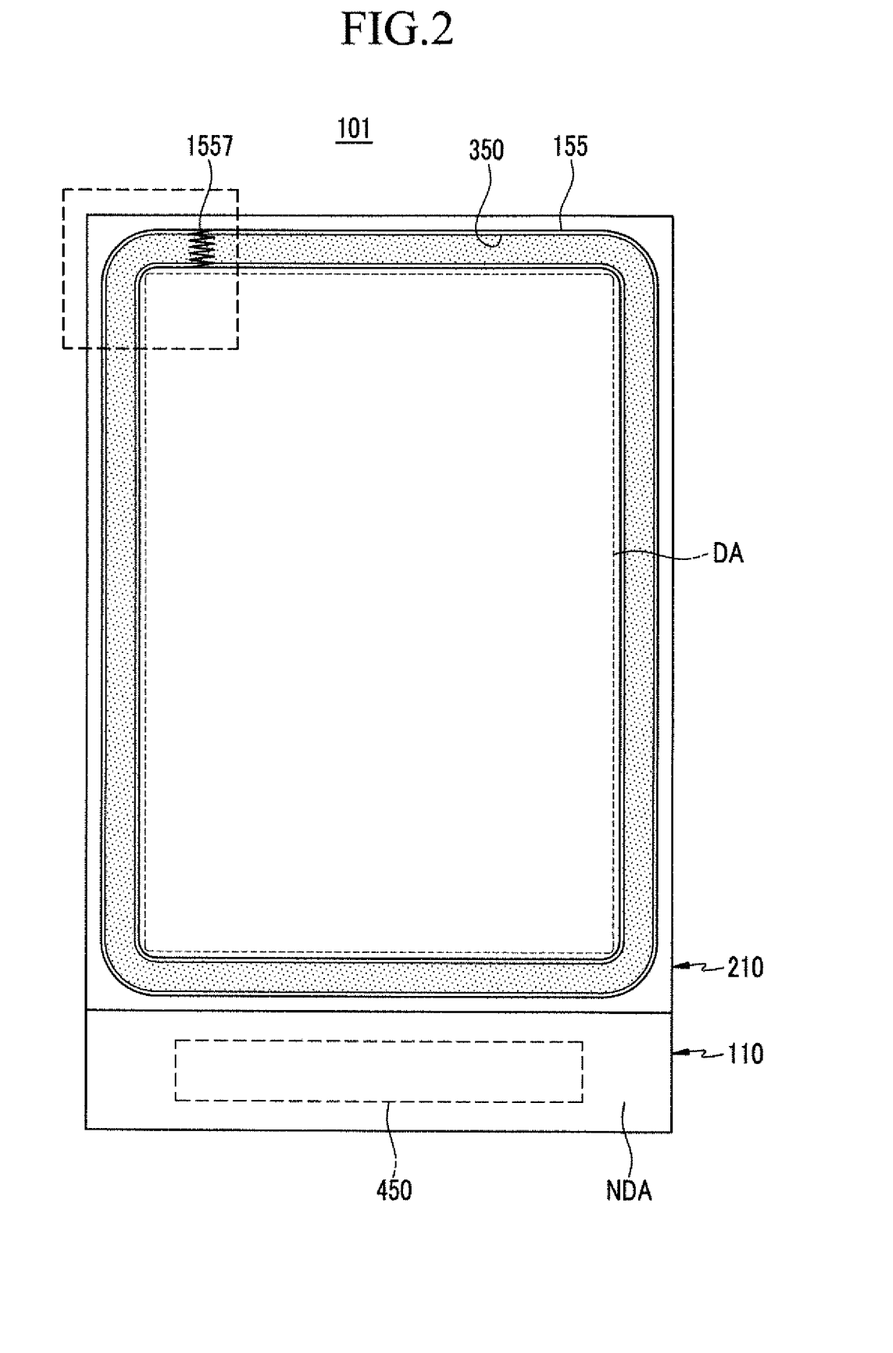
FIG. 2 is a top plan layout view of the OLED display of FIG. 1.
Figure 3:
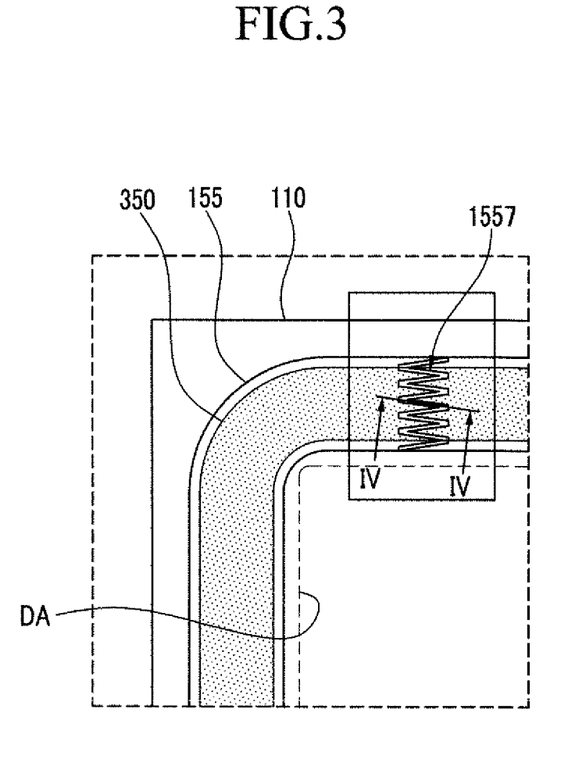
FIG. 3 is a partially enlarged top plan view of the OLED display of FIG. 2.

FIG. 2 is a top plan layout view of the OLED display of FIG. 1; and FIG. 3 is a partially enlarged top plan view of the OLED display of FIG. 2.

As shown in FIG. 2, the metal wire 155 is formed along the sealant 350 between the first substrate 110 and the sealant 350. One area of the metal wire 155 has an opening pattern 1557. The metal wire 155 is disconnected at the opening pattern 1557. Excluding the opening pattern 1557, the metal wire 155 is formed so as to surround the display area DA along the edge of the first substrate 110. That is, the metal wire 155 may be formed in the same pattern as the sealant 350, except for the area formed in the shape of the opening pattern 1557.

In further detail, the opening pattern 1557 of the metal wire 155 has a zigzag shape. The zigzag shape of the opening pattern 1557 is continued in a direction crossing a length direction of the metal wire 155 while reciprocating the length direction of the metal wire 155.

Figure 4:
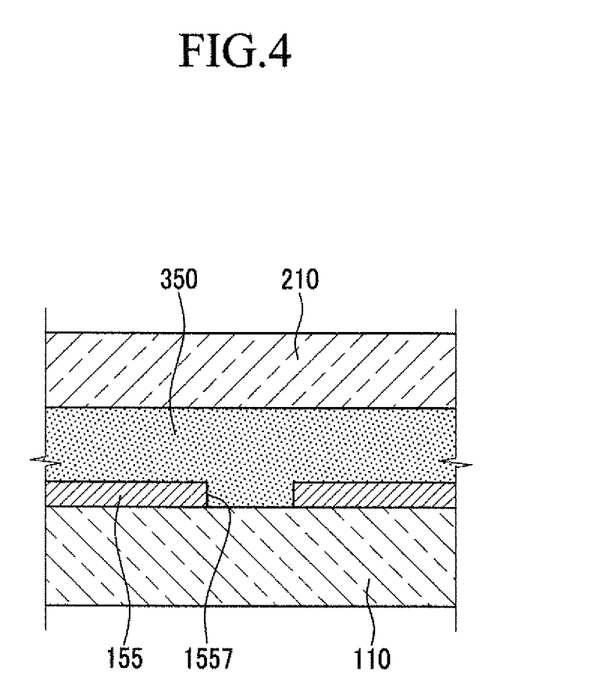
FIG. 4 is a cross-sectional view of FIG. 3, taken along the line IV-IV.

FIG. 4 is a cross-sectional view of FIG. 3, taken along the line IV-IV. FIG. 4 shows the metal wire 155 in the state of being disconnected at the opening pattern 1557.

Irradiation of the laser beam for curing the sealant 350 starts from the area where the opening pattern 1557 is formed in the metal wire 155, and is continued along the closed-loop shaped sealant 350 and the ends in the area where the opening pattern 1557 is formed.

In addition, the metal wire 155 may include a metal having a high reflection rate selected from Al, Mo, Ti, Ag, and Mg, or it may include an alloy including at least one of the metals.

Furthermore, although not illustrated, various conductive wires extended in the non-display area NDA from the display area DA may be arranged, together with the metal wire 155, in an insulated manner between the metal wire 155 and the first substrate 110 so as to supply signals or power.

With such a configuration, the OLED display 101 according to the first exemplary embodiment of the invention can improve uniformity of the sealant 350 while stably curing the sealant 350 which seals the pair of substrates 110 and 210 using the laser.

Hereafter, the organic light emitting element 70 and the thin film transistor 10 formed in the display area DA of the first substrate 110 in the OLED display 101 according to the first exemplary embodiment will be described with reference to FIG. 5.

Figure 5:
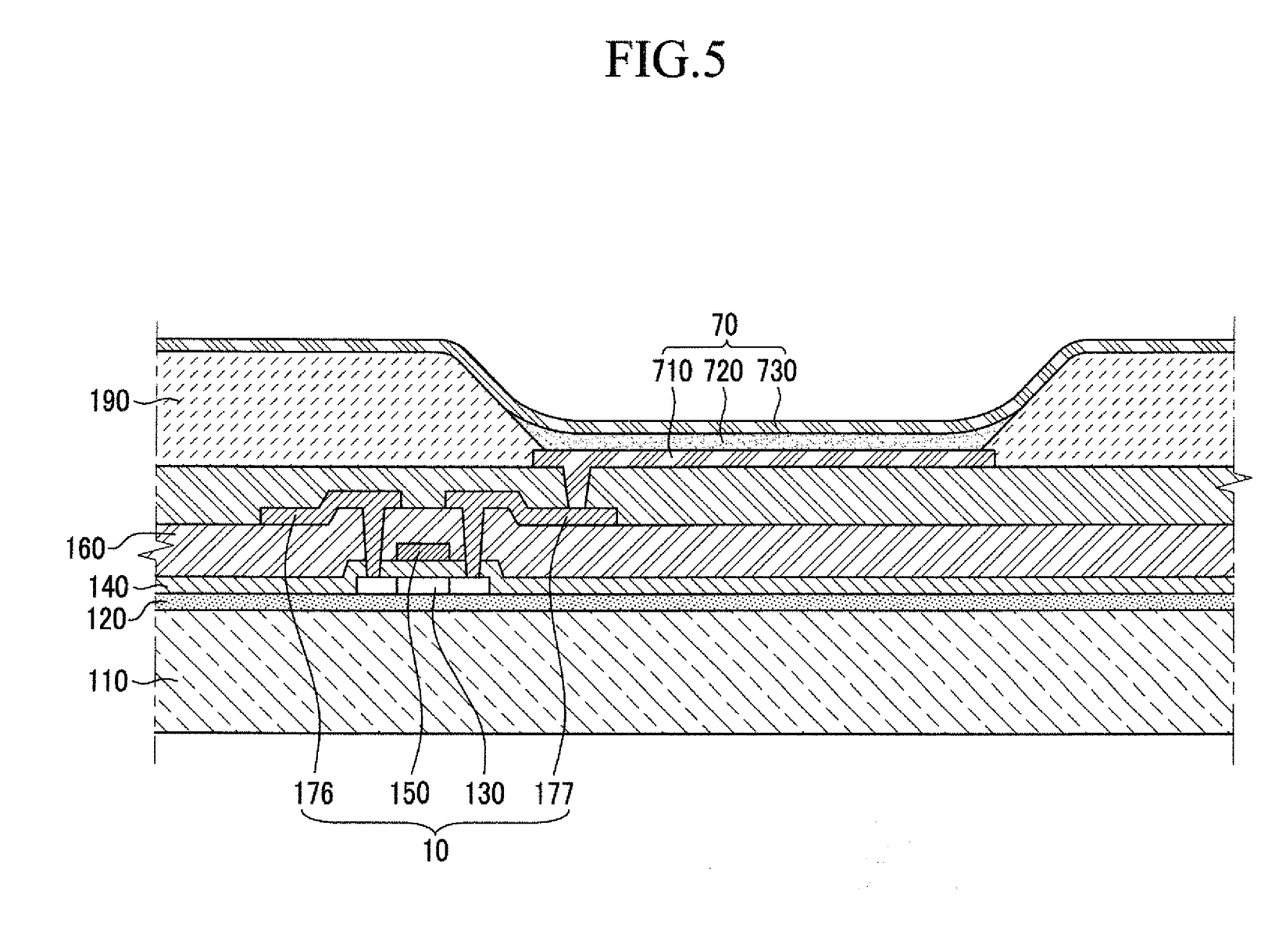
FIG. 5 is a partially enlarged cross-sectional view of an organic light emitting element of the OLED display of FIG. 1.

FIG. 5 is a partially enlarged cross-sectional view of an organic light emitting element of the OLED display of FIG. 1.

The thin film transistor 10 includes a semiconductor layer 130, an electrode 150, a source electrode 176, and a drain electrode 177.

In the first exemplary embodiment of the invention, the semiconductor layer 130 is formed of a polycrystalline silicon layer. However, the first exemplary embodiment is not limited thereto. Thus, the semiconductor layer 130 may be formed of an amorphous silicon layer or an oxide semiconductor.

The gate electrode 150 is arranged on one area of the semiconductor layer 130, and a gate insulation layer 140 is arranged between the gate electrode 150 and the semiconductor layer 130. The gate electrode 150 may be made of various conducting materials known to a person skilled in the art. The gate insulating layer 140 may include at least one of tetraethyl orthosilicate (TEOS), silicon nitride ($SiN_x$), and silicon oxide ($SiO_2$). For example, the gate insulating layer 140 may have a double-layered structure in which a silicon nitride layer having a thickness of 40 nm and a TEOS layer having a thickness of 80 nm are sequentially layered. However, the gate insulating layer 140 of the first exemplary embodiment is not limited thereto.

The source electrode 176 and the drain electrode 177 respectively contact the semiconductor layer 130. The source electrode 176 and the drain electrode 177 may be made of various conducting materials known to a person skilled in the art. The source electrode 176 and the drain electrode 177 are separated from each other, and are insulated from the gate electrode 150. An interlayer insulating layer 160 may be disposed between the source electrode 176 and the drain electrode 177. The interlayer insulating layer 160 may be made of various insulating materials known to a person skilled in the art.

The organic light emitting element 70 includes a pixel electrode 710 connected to the drain electrode 177 of the thin film transistor 10, an organic emission layer 720 formed on the pixel electrode 710, and a common electrode 730 formed on the organic emission layer 720. The organic light emitting element 70 may further include a pixel defining layer 190 having an opening which partially exposes the pixel electrode 710, and defining a light emission area. The organic emission layer 720 may emit light in the opening of the pixel defining layer 190.

In the first exemplary embodiment of the invention, the structures of the thin film transistor 10 and the organic light emitting element 70 are not limited to the structures shown in FIG. 1. The thin film transistor 10 and the organic light emitting element 70 may have various structures within the scope which can be easily modified by a person skilled in the art.

The OLED display 101 further includes a barrier layer 120 disposed between the thin film transistor 10 and the substrate 110. In further detail, the barrier layer 120 may be arranged between the semiconductor layer 130 and the substrate 110. For example, the barrier layer 120 may have a single-layered structure of silicon nitride ($SiN_x$) or a double-layered structure in which silicon nitride ($SiN_x$) and silicon oxide ($SiO_2$) are layered. The barrier layer 120 prevents the penetration of impurity elements or unnecessary components, such as moisture, and planarizes the surface. However, the barrier layer 120 may be omitted depending on the type and process conditions of the substrate 110.

Hereinafter, a manufacturing method of the OLED display 101 according to the first exemplary embodiment will be described.

First, as shown in FIG. 1, a first substrate 110, like the one shown in FIG. 1, is prepared. In addition, a thin film transistor 10 and an organic light emitting element 70, like the ones shown in FIG. 5, are provided in the display area DA of the first substrate 110.

In addition, a metal wire 155, like the one shown in FIG. 1 and FIG. 2, is formed in a non-display area NDA of the first substrate 110. The metal wire 155 is formed along an edge of the first substrate 110.

One area of the metal wire 155 has an opening pattern 1557. The opening pattern 1557 of the metal wire 155 is formed in the shape of a zigzag. The zigzag pattern of the opening pattern 1557 is continued in a direction crossing the length direction of the metal wire 155 while reciprocating along the length direction of the metal wire 155. Thus, the metal wire 155 is disconnected at the opening pattern 1557. Excluding the opening pattern 1557, the metal wire 155 is formed in the non-display area NDA of the first substrate 110 so as to surround the display area DA.

In addition, for efficient reflection of the laser beam, the metal wire 155 may include a highly reflective metal selected from, for example, Al, Mo, Ti, Ag, and Mg, or may include an alloy including at least one of Al, Mo, Ti, Ag, and Mg.

Furthermore, although not illustrated, various conductive wires may be formed between the metal wire 155 and the first substrate 110 so as to supply a signal or power. The conductive wires are non-uniformly formed in the non-display area NDA. In addition, the conductive wires may be insulated from the metal wire 155.

Next, a sealant 350 is formed on the metal wire 155. The sealant 350 is formed in a closed loop shape so as to surround the display area DA. The sealant 350 may be equal to or smaller in width than the metal wire 155.

Next, a second substrate 210 is arranged opposite the first substrate 110, with the sealant 350 interposed therebetween. Then, a laser beam is irradiated onto the sealant 350 so as to cure the sealant 350. In this case, irradiation of the laser beam is started from an area where the opening pattern 1557 of the metal wire 155 is formed, continued to the closed loop along the sealant 350, and then finished at the area where the opening pattern 1557 is formed.

The sealant 350 is cured while being directly irradiated with the laser beam, and is then cured again by the laser beam reflected by the metal wire 155. Accordingly, the sealant 350 can be effectively cured.

In addition, the metal wire 155 covers the various conductive wires formed in the display area DA, and is then extended to the non-display area NDA so that the sealant 350 can be uniformly cured. When no metal wire 155 contacting the sealant 350 exists under the sealant 350, the laser beam may be non-uniformly reflected due to the non-uniformly formed conductive wires, or the thermal conductivity of an area where the conductive wires are formed is different from that of an area where the conductive wires are not formed so that the sealant 350 cannot be uniformly cured.

In addition, since the irradiation of the laser beam is started from the area where the opening pattern 1557 of the metal wire 155 is formed and then finished at the same area where the opening pattern 1557 is formed, the curing of the sealant 350 can be prevented from being non-uniform in the irradiation start and end portions when the start portion and the end portion are overlapped with each other. The laser beam is reflected less at the area where the opening pattern 1557 of the metal wire 155 is formed than at the other area, and thermal conductivity of the area is relatively lower than that of the other area. In particular, since the metal wire 155 is disconnected at the opening pattern 1557, the thermal conductivity of the area where the opening pattern 1557 is formed can be effectively decreased. The opening pattern 1557 formed in the zigzag shape can stably and very effectively decrease the thermal conductivity of the area where the opening pattern 1557 is formed.

Thus, the sealant 350 is less cured when the laser beam is initially irradiated, and the less-cured sealant 350 can be cured to a proper level when the irradiation of the laser beam is finished. That is, the laser beam is irradiated two times to the area where the opening pattern 1557 is formed so that the curing degree of the sealant 350 can be prevented from being different from the other area.

With such a structure, a process for controlling the output of the laser beam for each period so as to uniformly cure the sealant 350 can be omitted.

In the method for manufacturing the OLED display 101 according to the first exemplary embodiment of the invention, the sealant 350 which seals the pair of substrates 110 and 210 can be stably cured using the laser beam, and simultaneously uniformity of the sealant 350 can be improved.

Figure 6:
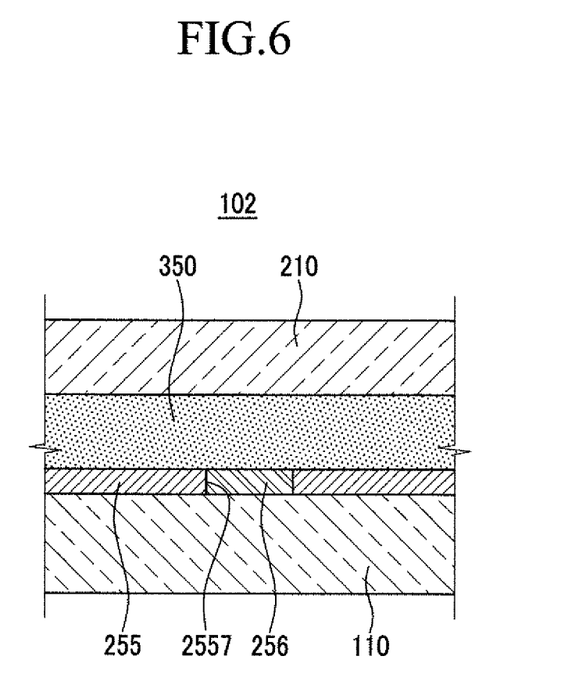
FIG. 6 is a partial cross-sectional view of an OLED display according to a second exemplary embodiment of the invention.

FIG. 6 is a partial cross-sectional view of an OLED display according to a second exemplary embodiment of the invention.

Hereinafter, the second exemplary embodiment will be described with reference to FIG. 6.

As shown in FIG. 6, an OLED display 102 according to the second exemplary embodiment further includes an additional metal layer 256 filling an opening pattern 2557 of a metal wire 255.

The additional metal layer 256 is formed of a metal having relatively lower thermal conductivity compared to a metal forming the metal wire 255.

With such a configuration, the OLED display 102 according to the second exemplary embodiment can further stably cure a sealant 350.

Furthermore, excluding the additional process for forming the additional metal layer 256 to fill the opening pattern 2557 of the metal wire 255, the manufacturing method of the OLED display 102 according to the second exemplary embodiment is the same as that of the first exemplary embodiment.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
   a first substrate;
   a second substrate arranged opposite to the first substrate;
   a sealant arranged in a shape of a closed loop along an edge of the second substrate between the first substrate and the edge of the second substrate; and
   a metal wire formed as a continuously single integral and monolithic metal pattern having opposite ends separated from each other at least in part at a single open pattern formed by terminal surfaces of the metal wire that face and are spaced-apart from each other, the metal wire extending along the closed loop between the first substrate and the sealant.

2. The OLED display device of claim 1, wherein the metal wire is disconnected at the single open pattern.

3. The OLED display device of claim 1, wherein the single open pattern has a zigzag shape.

4. The OLED display device of claim 3, wherein the zigzag shape of the single open pattern is continued in a direction which crosses a length-wise direction of the metal wire while moving forward and backward along the length-wise direction of the metal wire.

5. The OLED display device of claim 1, further comprising an organic light emitting element formed on the first substrate, wherein the organic light emitting element is surrounded by the sealant.

6. The OLED display device of claim 1, further comprising an additional metal layer filling the single open pattern.

7. The OLED display device of claim 6, wherein the additional metal layer is formed of a metal having a thermal conductivity which is relatively lower than a thermal conductivity of a metal forming the metal wire.

8. A method of manufacturing an organic light emitting diode (OLED) display device, comprising the steps of:
   preparing a first substrate;
   forming a metal wire along an edge of the first substrate, the metal wire formed as a continuously single integral and monolithic metal pattern having opposite ends separated from each other at least in part at a single open pattern formed by terminal surfaces of the metal wire that face and are spaced-apart from each other;
   forming a sealant on the metal wire and on the substrate in a closed loop shape by arranging the sealant along the continuously single integral and monolithic metal pattern and the single open pattern;
   arranging a second substrate opposite the first substrate;
   interposing the sealant between the first and second substrates; and
   curing the sealant, by first irradiating a laser beam onto the sealant along the metal wire from one end of the continuously single integral and monolithic metal pattern to another end of the continuously single integral and monolithic metal pattern and then irradiating the laser beam onto the sealant arranged at the single open pattern.

9. The method of claim 8, wherein the metal wire is disconnected at the open pattern.

10. The method of claim 8, wherein the single open pattern is formed in the shape of a zigzag.

11. The method of claim 10, wherein the zigzag shape of the single open pattern is continued in a direction crossing a length-wise direction of the metal wire while reciprocating along the length-wise direction of the metal wire.

12. The method of claim 8, further comprising the step of forming an organic light emitting element on the first substrate, wherein the sealant is formed so as to surround the organic light emitting element.

13. The method of claim 8, further comprising the step of forming an additional metal layer which fills the single open pattern.

14. The method of claim 13, wherein the additional metal layer is formed of a metal having a thermal conductivity which is relatively lower than a thermal conductivity of a metal forming the metal wire.

15. The organic light emitting diode (OLED) display device manufactured by the method of claim 8, comprised of the sealant arranged in the shape of the closed loop along an edge of the second substrate between the first substrate and the edge of the second substrate.

16. The organic light emitting diode (OLED) display device manufactured by the method of claim 8, comprised of the metal wire being disconnected at the single open pattern.

17. The organic light emitting diode (OLED) display device manufactured by the method of claim 8, comprised of the single open pattern having a zigzag shape.

18. The organic light emitting diode (OLED) display device manufactured by the method of claim 8, comprised of the zigzag shape of the single open pattern continuing in a direction crossing a length-wise direction of the metal wire while moving forward and backward along the length-wise direction of the metal wire.

19. The organic light emitting diode (OLED) display device manufactured by the method of claim 8, further comprising an additional metal layer filling the single open pattern, the additional metal layer being formed of a metal having a thermal conductivity that is relatively lower than a thermal conductivity of a metal forming the metal wire.

* * * * *